(12) United States Patent
Zennamo, Jr. et al.

(10) Patent No.: US 6,791,436 B2
(45) Date of Patent: Sep. 14, 2004

(54) MODULAR ELECTRICAL SIGNAL FILTER ASSEMBLY

(75) Inventors: Joseph A. Zennamo, Jr., Skaneateles, NY (US); Joseph N. Maguire, Syracuse, NY (US)

(73) Assignee: Eagle Comtronics, Inc., Clay, NY (US)

( * ) Notice: Subject to any disclaimer, the term of this patent is extended or adjusted under 35 U.S.C. 154(b) by 78 days.

(21) Appl. No.: 10/329,055

(22) Filed: Dec. 24, 2002

(65) Prior Publication Data

US 2003/0151470 A1 Aug. 14, 2003

Related U.S. Application Data

(63) Continuation-in-part of application No. 10/187,455, filed on Jul. 1, 2002, which is a continuation-in-part of application No. 09/456,596, filed on Dec. 8, 1999, now Pat. No. 6,429,754.

(51) Int. Cl.[7] .............................................. H03H 7/00
(52) U.S. Cl. ........................ 333/185; 333/175; 333/167
(58) Field of Search ............................... 333/185, 175, 333/167; 439/620

(56) References Cited

U.S. PATENT DOCUMENTS

| | | | |
|---|---|---|---|
| 4,451,803 A | | 5/1984 | Holdsworth et al. |
| 4,701,726 A | * | 10/1987 | Holdsworth ................ 333/185 |
| 4,845,447 A | | 7/1989 | Holdsworth |
| 5,150,087 A | * | 9/1992 | Yoshie et al. ................ 333/185 |
| 5,278,525 A | * | 1/1994 | Palinkas ..................... 333/175 |
| 5,440,282 A | | 8/1995 | Devendorf et al. |
| 5,770,983 A | | 6/1998 | Zennamo, Jr. et al. |
| 6,165,019 A | | 12/2000 | Kha et al. |
| 6,255,920 B1 | | 7/2001 | Ohwada et al. |
| 6,273,766 B1 | | 8/2001 | Zennamo, Jr. et al. |
| 6,429,754 B1 | * | 8/2002 | Zennamo et al. ........... 333/167 |

* cited by examiner

*Primary Examiner*—Robert Pascal
*Assistant Examiner*—Dean Takaoka
(74) *Attorney, Agent, or Firm*—Burr & Brown

(57) ABSTRACT

A modular electronic signal filter assembly is provided, including a plurality of modular filter housing members joined to one another in a longitudinal direction via a plurality of coupling members. The outer peripheral surfaces of the filter housing members are provided with mechanical engagement members that engage and mate with a corresponding mechanical engagement member provided on the inner peripheral surface of the coupling members to secure the filter housing members to one another without solder. The coupling members also include an electrical connection member for electrically connecting the filter housing members in a solderless manner. The modularity of the filter housing assembly of the present invention provides heretofore unrealizable flexibility and applicability of a single filter housing unit for any filter application. Moreover, the present invention enables the assembly of modular filter housing and coupling member units without the need for solder.

29 Claims, 11 Drawing Sheets

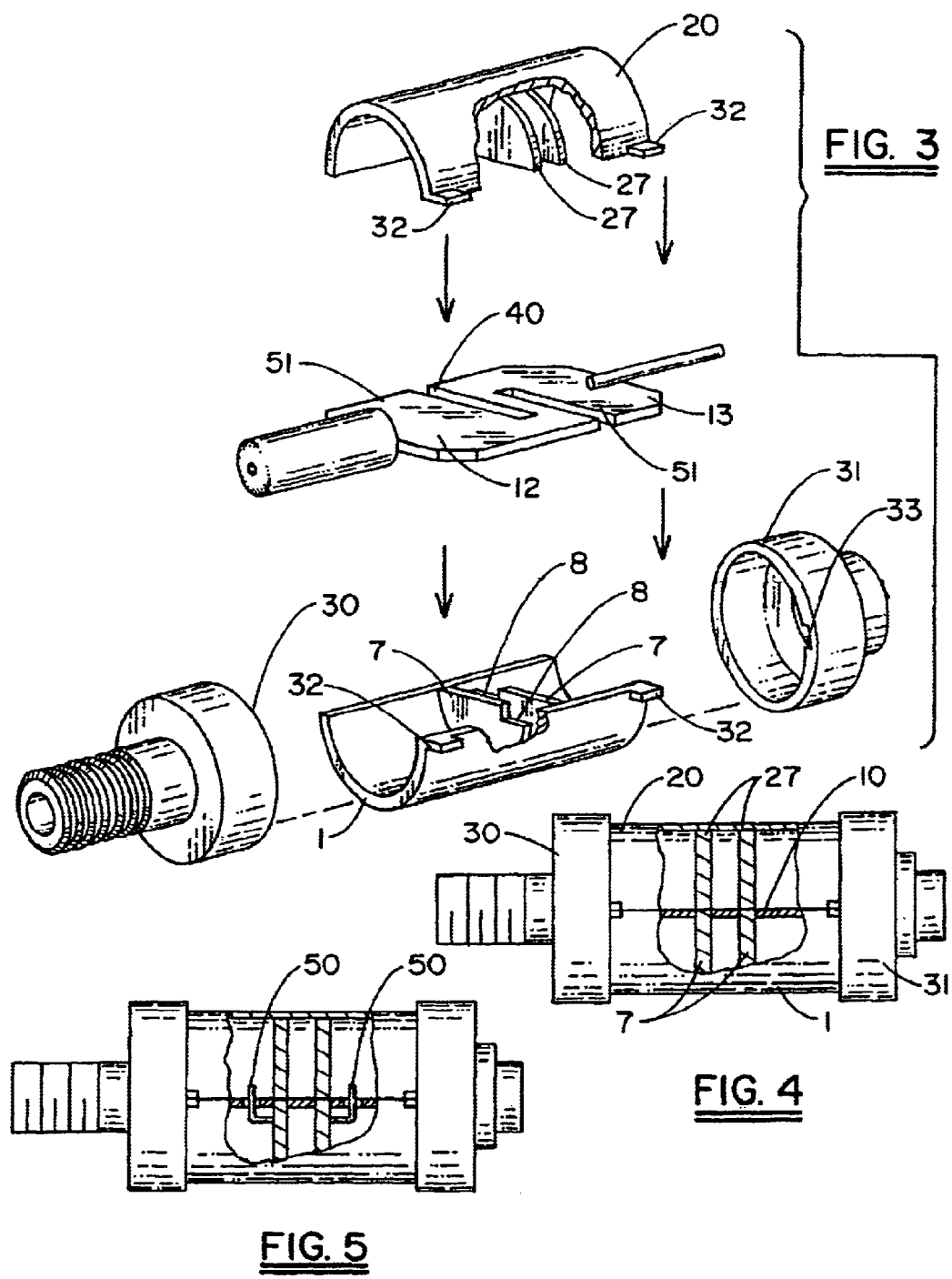

MODULAR ELECTRICAL SIGNAL FILTER ASSEMBLY

CROSS REFERENCE TO RELATED APPLICATIONS

This is a continuation-in-part of U.S. application Ser. No. 10/187,455, filed Jul. 1, 2002, which in turn is a continuation-in-part of U.S. application Ser. No. 09/456,596, filed Dec. 8, 1999 (now U.S. Pat. No. 6,429,754), the entireties of which are incorporated herein by reference.

FIELD OF THE INVENTION

The present invention relates to an electrical signal filter with an improved isolation shield for magnetically isolating electrically interconnected filter sections from one another. The present invention also relates to a modular electrical signal filter and filter assembly whose component parts can be assembled without the use of solder.

BACKGROUND OF THE INVENTION

Various types of electrical signal filters are used in the CATV industry for controlling, on a frequency basis, the propagation of signals through a cable line. One example of such a filter is disclosed in U.S. Pat. No. 4,451,803, the entirety of which is incorporated herein by reference. The '803 patent discloses a split tuning filter of the type that is commonly referred to as a notch filter, for removing a selected frequency or band of frequencies from a CATV signal. With reference to FIG. 7, the split tuning filter includes a common circuit board 100 having first 102 and second 103 filter sections formed thereon by discrete electronic components such as inductors, capacitors and the like (not shown). Isolation shields 104, 105 are arranged at a midpoint along circuit board 100 to provide magnetic isolation between first filter section 102 and second filter section 103. Each shield includes a radially extending disc section 106 and a longitudinally extending flange section 107. A slot 108 is formed in each shield, to allow the remaining, unslotted portion of disc 106 to slide into a corresponding slot 101 formed in circuit board 100. One of the shields is pressed into a slot formed on one side of the circuit board, and the other shield is pressed into a slot formed on an opposed side of the circuit board, as shown in FIG. 7. As explained in the '803 patent, this arrangement prevents any "line of sight" communication between components in the first and second filter sections.

Once the shields 104, 105 are positioned on opposite sides of circuit board 100, the circuit board is inserted into housing 109, the open end of which is closed by filter cap 110. This subassembly is then inserted into a tube sleeve housing (not shown) to form the final sealed filter structure.

While the filter disclosed in the '803 patent is highly successful in providing magnetic isolation between the first 102 and second 103 filter sections, there are several drawbacks associated with the use of shields 104 and 105. First, the shields must be soldered not only to circuit board 100, but also to filter housing 109, in order to ground the circuit board. While the shields can be soldered to circuit board 100 with relative ease, it is relatively difficult to solder the shields to filter housing 109 once the shields are positioned within the confines of the housing. In order to achieve this type of soldering operation, it is necessary to apply a high heat source to the exterior of filter housing 109, which can adversely effect the characteristics of the electrical components already positioned on circuit board 100. It is also difficult to control the flow of solder within the confines of filter housing 109, and thus it is not uncommon for one or both sides of the filter to become shorted. Such shorted filters must, of course, be discarded.

Another problem relates to flange 107. The flange is present on each shield in order to guide circuit board 100 into filter housing 109 and to provide a soldering surface parallel to the wall of filter housing 109. The electronic components on the circuit board, however, must be spaced away from the shields by a distance greater than the longitudinal length of flange 107 to allow the shields to be inserted into slots 101 on opposite sides of circuit board 100. The longitudinal length of flange 107, therefore, unnecessarily increases the overall length of the filter. This problem is even more noticeable in six-pole and eight-pole filters, which use multiple shields.

Yet another problem is that the shields, being separate components, increase the total number of components that must be handled during assembly of the overall filter device. This in turn increases manufacturing time and expense.

Yet another problem with the prior art filter shown in FIG. 7 is that the end cap 110 must be soldered to the filter housing 109 in order to prevent rotation of the end cap 110 independent of the filter housing 109. Since the filter is rotatably installed as a unit, it is unacceptable if one part of the filter is able to rotate independent of other parts of the filter. This necessary soldering step adds expense to the overall filter assembly. Although electronic components of the circuit board 100 are soldered in place, that soldering step can be performed in a very efficient, mass-production scale prior to assembly of the filter components into the final filter product.

In order to ensure a good ground contact between the circuit board 100, the shields 104 and 105, and the housing 109, it is also necessary to solder the shields to the board to the housing during assembly of the filter. This soldering step also adds expense to filter assembly, and can be quite difficult, since the shields are positioned inside the filter housing 109 during the soldering operation.

Another problem prevalent in the CATV filter industry is that each distinct filter application currently requires a distinctly accommodating filter housing. Given the vast number of different types of filter applications, it has become necessary to design, manufacture, and maintain sufficient inventories of each individual type of filter housing for each of the different filter application products offered. This can be particularly inconvenient and expensive for electronic signal filter providers that offer a wide variety of products for a wide variety of applications.

For example, providing the machinery and manpower required to machine a large number of different filter housings having different design specifications and considerations can be an expensive undertaking. Even when the filter housing is designed to be formed by casting rater than being produced using machining techniques, producing a large number of different filter housings nonetheless mandates the use of many different manufacturing molds.

Moreover, different filter housing configurations may require different manufacturing steps to complete the assembly of the final electronic signal product, depending on the structural design. As mentioned above, additional manufacturing processes, such as manual assembly or soldering steps, drive up the cost of the final products, introduce additional opportunities for quality control issues to arise, and further complicate the manufacturing process. Accordingly, the need to manage and control the varying specifications and requirements for production of varying design applications involves increased manpower and equipment required to monitor and ensure quality, which ultimately increases production costs. Additionally, the expenses associated with providing storage facilities and logistics support in the form of personnel, equipment and for complex inventory management are another cost aspect that increases the costs of the final filter products.

It would be desirable to provide an electrical signal filter having isolation shields that are easy to handle and solder within the filter housing. It would be more desirable to provide an electrical signal filter whose component parts can be assembled into the final filter product without any soldering steps. It would also be desirable to provide a "universal" modular filter housing that can be used for any filter application, either alone as a single modular unit or in combination with a plurality of other modular units. It would also be desirable to provide modular filter components that can be assembled into the desired filter assembly configurations without any soldering steps.

SUMMARY OF THE INVENTION

It is an object of the present invention to provide an electrical signal filter that can overcome all the drawbacks associated with the prior art filters discussed above. In accordance with one object of the present invention, an electrical signal filter is provided that includes an elongate lower filter housing member extending along a first longitudinal direction from a first end thereof to an opposed second end thereof, and having an inner surface terminating at first and second upper side surfaces that extend from the first end to the second end. The filter also includes an elongate upper filter housing member extending along the first longitudinal direction from a first end thereof to an opposed second end thereof, and having an inner surface terminating at first and second lower side surfaces that extend from the first end to the second end. The elongate upper filter housing member abuts the elongate lower filter housing member at the first and second lower and upper side surfaces, respectively, along a longitudinal junction. An isolation shield is formed integrally with at least the elongate lower filter housing member and extends inwardly and upwardly from the inner surface thereof in a direction substantially perpendicular to the first longitudinal direction to thereby define first and second internal filter cavities separated by the isolation shield. A first filter section is arranged in the first internal filter cavity and a second filter section, electrically connected to the first filter section, is arranged in the second internal filter cavity. The isolation shield provides magnetic isolation between the first and second filter sections.

In accordance with a preferred embodiment, the isolation shield extends inwardly and upwardly from the inner surface of the elongate lower filter housing member to a position proximate a plane intersecting the first and second upper side surfaces thereof, and a second isolation shield is formed integrally with the elongate upper filter housing member and extends inwardly and downwardly from the inner surface thereof in axial alignment with the isolation shield of the elongate lower filter housing member.

More preferably, the upper surface of the isolation shield of the elongate lower filter housing member has a shape that is complementary to a shape of the lower surface of the second isolation shield of the elongate upper filter housing member, and those surfaces mate with each other to form the appearance of an integral shield.

In accordance with another embodiment of the invention, an electrical signal filter is provided that includes an elongate lower filter housing member extending along a first longitudinal direction from a first end thereof to an opposed second end thereof, and having an inner surface terminating at first and second upper side surfaces that extend from the first end to the second end, and an elongate upper filter housing member extending along the first longitudinal direction from a first end thereof to an opposed second end thereof, and having an inner surface terminating at first and second lower side surfaces that extend from the first end to the second end. The elongate upper filter housing member abuts the elongate lower filter housing member at a junction between the first and second lower side surfaces and the first and second upper side surfaces, respectively, to thereby define an internal filter cavity. A ground post is formed integrally with the lower filter housing member and extends upwardly from the inner surface thereof in a direction substantially perpendicular to the first longitudinal direction. A circuit board is positioned within the filter cavity and has a ground terminal fastened to the ground post without the use of solder. First mechanical engagement members extend circumferentially around portions of the outer surface of each of the upper and lower filter housing members proximate the first and second ends thereof. End caps are positioned on the first and second ends of the abutted upper and lower filter housing members, and each of the end caps has a second mechanical engagement member formed on an inner surface thereof that is complementary to and mates with the first mechanical engagement members formed on the upper and lower filter housing members.

The structure of this embodiment allows for the omission of any soldering steps during assembly of the component parts of the filter, because a mechanical engagement is provided between the ground post of the lower filter housing member and the circuit board, and mechanical engagement members are also used for preventing rotation of the end caps to the abutted filter housing members. As a result, the overall cost of manufacturing the filter can be reduced.

According to another embodiment of the present invention, a modular filter housing assembly is provided, including a plurality of elongate filter housings. In particular, a first filter housing is included, extending in a longitudinal direction from a first end thereof to an opposed second end thereof and having a mechanical engagement member provided on at least one of the first and the second ends thereof. A second filter housing is also included, extending in the longitudinal direction from a first end thereof to an opposed second end thereof and having a mechanical engagement member provided on at least one of the first and the second ends thereof. Further, a coupling member is also included, having a first end provided with a corresponding mechanical engagement member to engage the mechanical engagement member provided on one of the first and the second ends of one of the first and the second filter housings and an opposed second end provided with a corresponding mechanical engagement member to engage the mechanical engagement member provided on one of the first and second ends of the other filter housing to join the first filter housing and the second filter housing to one another in a solderless connection via the coupling member.

Preferably, the mechanical engagement member of the first filter housing comprises an outer surface portion of the first end of the first filter housing having an outer diameter $d_1$, and the mechanical engagement member of the second filter housing comprises an outer surface portion of the first end of the second filter housing having an outer diameter $d_2$.

Further, the first end of the coupling member comprises an inner surface having an inner diameter $d_3$, and the second of the coupling member comprises an inner surface having an inner diameter $d_4$. Preferably, inner diameter $d_3$ is sufficiently less than outer diameter $d_1$ to provide a secure mechanical press-fit between the first end of the first filter housing and the first end of the coupling member, and inner diameter $d_4$ is sufficiently less than outer diameter $d_2$ to provide a secure mechanical press-fit between the first end of the second filter housing and the second end of the coupling member.

The secure press-fit relationship between the filter housings and the coupling member eliminates the need to provide solder at this joining region, and thus reduces the required production materials (i.e. solder), reduces the number of manufacturing steps, and ultimately lowers the costs associated with producing an electrical filter assembly for any particular application.

The modularity achieved by the present invention also offers heretofore unrealized flexibility and convenience with respect to both manufacturing and logistics. That is, any desired filter application can be assembled using a "universal" modular filter housing that can be interconnected with any number of other like modular filter housings via a single type of coupling member to fulfill any particular application specification.

Thus, the filter housings and coupling members can be used for all filter application products offered by a particular entity and tailored to a particular product application as demanded. This eliminates the need to stock and manage a large number of different filter housings suited to accommodate all of the filter application products offered. This also streamlines the overall manufacturing process associated with filter housing production, since a single mold design or machining set-up can be used to produce all of the modular filter housing and coupling member units.

The mechanical engagement member of the first filter housing preferably extends circumferentially around at least a portion of an outer surface thereof proximate the first end thereof, and the mechanical engagement member of the second filter housing member extends circumferentially around at least a portion of an outer surface thereof proximate the first end thereof.

According to another embodiment of the present invention, each of the mechanical engagement members of the first and the second filter housing members include anti-rotational mechanisms, and each of the corresponding mechanical engagement members of the coupling member include corresponding anti-rotational mechanisms. Preferably, the anti-rotational mechanism of the first filter housing is one of a series of projected ribs and a series of grooves, and the corresponding anti-rotational mechanism of the first end of the coupling member is the other one of a series of projected ribs and a series of grooves. Similarly, the anti-rotational mechanism of the second filter housing is preferably one of a series of projected ribs and a series of grooves, and the corresponding anti-rotational mechanism of second end of the coupling member is preferably the other one of a series of projected ribs and a series of grooves.

The anti-rotational mechanism helps to maintain the structural integrity of the filter assembly by significantly reducing the degree to which the filter assembly experiences undesired longitudinal torque. That is, the interlocking anti-rotational mechanism substantially prevents the filter housings from rotating independently with respect to one another and with respect to the coupling member or members that interconnect the filter housings.

According to another embodiment of the present invention, the first filter housing also includes a mechanical engagement member formed on the second end thereof, and the second filter housing member further likewise includes a mechanical engagement member formed on the second end thereof. A plurality of end caps are also preferably provided. Each end cap preferably includes a corresponding mechanical engagement member provided on an inner surface thereof to engage a respective one of the mechanical engagement members provided on the second end of the first filter housing and the second end of the second filter housing.

The mechanical engagement members of the end caps also preferably include anti-rotational mechanisms that correspond to the anti-rotational mechanisms provided on the ends of the filter housing, as well. Preferably, the corresponding anti-rotational mechanisms of each end cap is the other one of a series of projected ribs and a series of grooves, depending upon which is provided on the corresponding second end of the respective filter housing members.

After the end caps are positioned on the ends of the filter housings, an outer protective tube is preferably secured over the end caps, the first and second filter housings, and the coupling member through interposed sealing members (e.g., O-rings). It should be noted, however, that according to another embodiment of the present invention, the aforementioned end caps can be integrally formed with the filter housings. In that manner, the casting and assembly process can be further simplified, as described in more detail below.

According to yet another embodiment of the present invention, each modular filter housing member includes a lower filter housing member and an abutted upper filter housing member that are solderlessly joined to one another in a vertical direction to form a split-housing member. Each end of each split housing member is connected to one of an end cap or a coupling member, essentially in the same manner as described above.

Again, the modularity afforded by the present invention allows the split housing members to be castably produced from a single mold or machined using a single machine set-up. Although the present invention preferably enables a single modular filter housing member design, or a like pair of modular split filter housing members, to be used for any filter application, it is also possible to assemble a wide variety of filter housing configurations for a wide variety of filter applications using only a few different upper and lower filter housing configurations that are able to accommodate different filter components. For example, filter components of varying heights, such as inductor coils, often call for filter housings having larger (or smaller) inner diameters. In that way, a very small number of different modular stock models could be used to tailor a filter for any desired application.

BRIEF DESCRIPTION OF THE DRAWINGS

For a better understanding of the nature and objects of the invention, reference should be made to the following detailed description of a preferred mode of practicing the invention, read in connection with the accompanying drawings, in which:

FIG. 3 is an exploded perspective view showing a filter in accordance with another embodiment of the present invention;

FIG. 4 is a partial sectional view of the filter of FIG. 3;

FIG. 5 is a partial sectional view of an alternative embodiment of the filter shown in FIG. 4;

DETAILED DESCRIPTION OF THE INVENTION

Figures 1, 2:
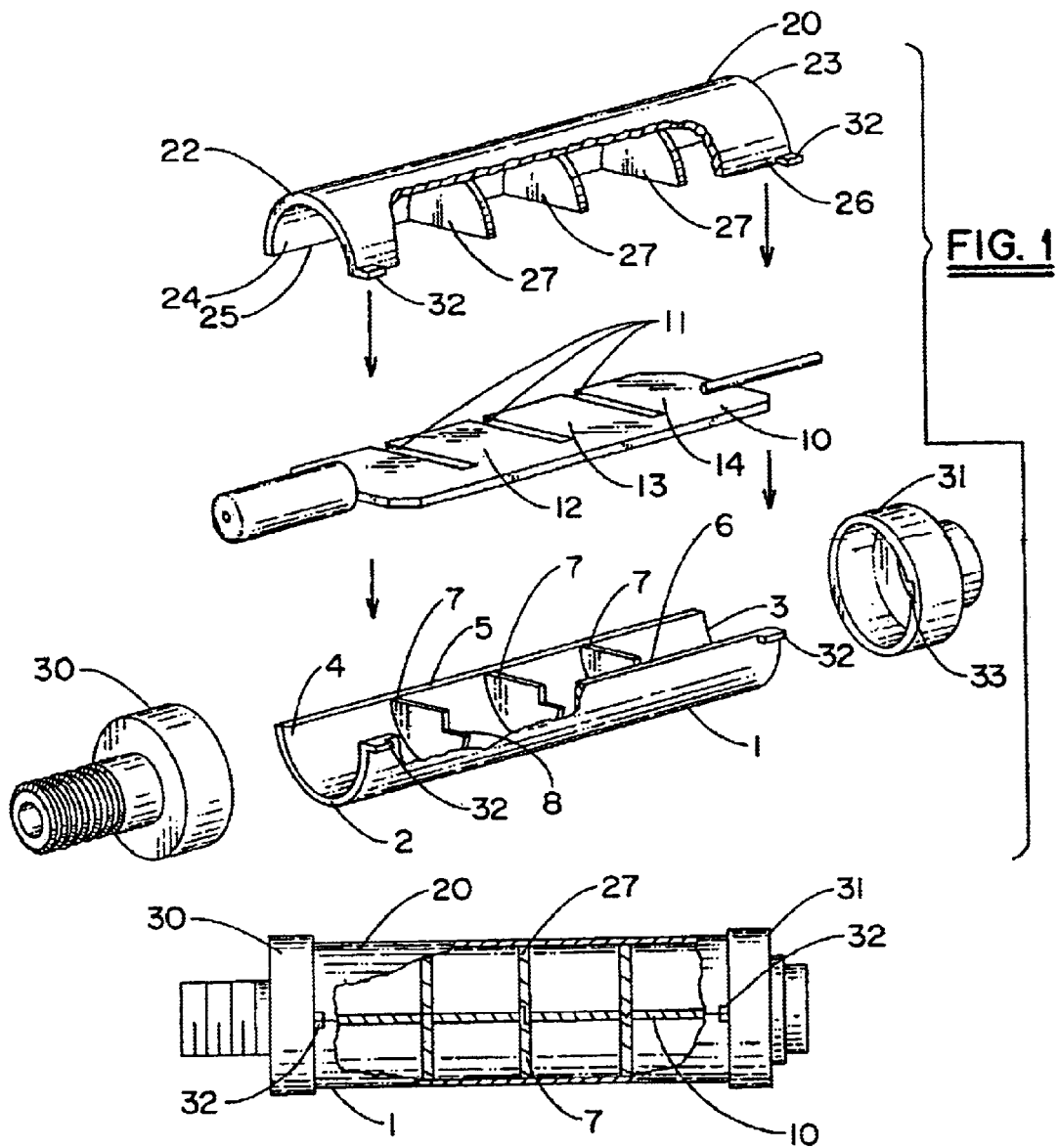
FIG. 1 is an exploded perspective view showing a filter in accordance with one embodiment of the present invention.
FIG. 2 is a partial sectional view of the filter of FIG. 1, showing various abutting surfaces for the upper and lower shield members.

FIG. 1 is an exploded perspective view of an electrical signal filter in accordance with one embodiment of the present invention. The filter includes a lower filter housing member 1 that generally takes the shape of one-half of a hollow cylinder; it could, however, take any shape that would allow the objectives of the invention to be realized. The lower filter housing member has a first end 3 and an opposed second end 2, and an inner surface 4 that extends from the first end 3 to the second end 2. Inner surface 4 terminates at first 5 and second 6 longitudinal side surfaces that also extend from first end 3 to second end 2 of lower housing member 1. Lower shield members 7 are formed integrally with lower housing member 1 and extend radially inwardly from inner surface 4 in a direction substantially perpendicular to the longitudinal axis of housing member 1. Each lower shield member 7 includes a recessed portion 8 that allows circuit board 10 to rest below the upper surface of shield member 7. Circuit board 10 includes slots 11 that allow the non-recessed portions of each lower shield member 7 to pass through circuit board 10.

Circuit board 10 includes a first filter section 12, a second filter section 13, and a third filter section 14, all electrically interconnected by conductor lines (not shown) formed on circuit board 10 around slots 11. The electronic components in each filter section have been omitted in the drawings. Exemplary components that could be used are disclosed in detail in U.S. Pat. No. 5,770,983, the entirety of which is incorporated herein by reference. Such a three-section filter could be used as a six-pole tier trap, for example. In such a filter, the filter sections 12, 13 and 14 need to be magnetically isolated from one another. The lower shield members 7 provide the necessary magnetic isolation between filter sections 12, 13 and 14 both within the body of circuit board 10 and in the lower section of housing member 1 beneath circuit board 10.

Upper filter housing member 20 has basically the same construction as lower filter housing member 1, in that it includes opposed first 22 and second 23 ends, and an inner surface 24 that terminates along longitudinal side surfaces 25 and 26. The upper shield members 27, however, take the shape of substantially semicircular discs with no recessed portions. The upper shield members 27 are aligned axially, along the longitudinal axis of the filter, with lower shield members 7 so that, when the upper and lower housing members about one another to form a cylindrical filter housing, the upper and lower shield members align to form metal disc shields that isolate the various filter sections on circuit board 10 from one another.

Once circuit board 10 is positioned within lower filter housing member 1, upper filter housing member 20 is abutted thereto along the respective longitudinal side surfaces of each housing member. It is preferred that the abutted longitudinal side surfaces 5, 6 and 25, 26, respectively, have complementary shapes, such as rabbet or chevron joints, to allow the housing members to abut in a mating fashion. Such mated abutment reduces RFI/EMI leakage outside the housing, and also inhibits the flow of potting foam outside the housing. It is possible, however, to form the longitudinal side surfaces as butt joints, and then solder the housing members along the junction of the respective longitudinal side surfaces.

FIG. 1 shows that the filter also includes connector end caps 30, 31 that close the first and second ends of the filter housings and provide connection points for external components. It is preferred that the end caps are press-fit over the ends of the abutted filter housing members. In this regard, the opposite ends of the filter housing could be of reduced diameter, such that the end caps, once in place, have an outside diameter the same as or only slightly larger than the outside diameter of the main central portion of the filter housing. If necessary, to provide additional sealing and/or mechanical integrity, the end caps can be soldered in place.

FIG. 1 also shows that the upper and lower filter housing members include boss members 32, that align when the housing members are abutted, to be received within complementary grooves 33 in end caps 30, 31. This arrangement prevents rotation of the end caps relative to the housing. This is important since the filter device is often rotated as a whole when installed and the device could be damaged if the end caps were allowed to rotate independent of the filter housing.

In accordance with a preferred embodiment of the present invention, the upper surface of lower shield members 7 and the lower surface of upper shield members 27 have complementary shapes, such as shown in FIG. 2, to allow the lower and upper shield members to mate with one another and form a more effective isolation shield. The left-hand shield in FIG. 2 shows the lower 7 and upper 27 shield members taking the shape of a simple butt joint, while the middle and right-hand shields show rabbet and chevron joints, respectively.

While any method could be used to form the filter housing members, it is preferred that the lower and upper housing members are cast or pressed to include the respective shield members as integral parts. This solves one of the problems associated with the prior art, in that the isolation shields and filter housing members can be handled as single units.

The filter shown in FIG. 1 also avoids the need to solder the isolation shields to the inner surface of the filter housing, as those shields are formed as integral extensions of the filter housing members. Moreover, since the filter housing members are split longitudinally, and the circuit board 10 is placed along the Z-axis direction into lower filter housing member 1, it is easier to solder circuit board 10 to each lower shield member 7 to establish a good ground contact (i.e., the solder joints are exposed). Moreover, the fact that the circuit board and upper housing member are assembled in the Z-axis direction facilitates mass production.

The materials used for the upper and lower filter housing members and the upper and lower shield members can be any of the materials conventionally used, such as die cast zinc alloy #3 or #5. If it is necessary to use a less electrically conductive material to form the integral housing and shield members, it is possible to coat the inner surfaces of the housing and shield members with an electrically conductive coating to provide sufficient electrical performance with respect to the necessary ground connections.

The integral construction of the housing and shield members also allows for a reduction in length of the overall filter device. It can be seen from the drawings that the shield members 7 and 27 do not have longitudinally extending flange members, as in the prior art. As a result, it is no longer necessary to space electrical components away from the shield members to allow room for the shield members to be inserted into the circuit board, as in the prior art. It is expected that at least 1/10 of an inch will be saved for every shield employed. This size reduction is significant in an industry such as the CATV industry, where component space is limited. The size reduction also reduces material cost.

FIGS. 3 and 4 show a filter having only two filter sections 12, 13 that need to be magnetically isolated from one another, such as a four-pole split tuning filter (see, for example, U.S. Pat. Nos. 4,451,803 and 5,770,983). It is known in the art that in this type of filter the four poles are tuned to the same frequency. As explained in the '803 patent, it is imperative to provide adequate magnetic isolation between the first and second filter sections to avoid detuning one filter section when tuning the other filter section. As such, it is preferable to use two lower shield members 7 having recesses 8 arranged on opposite sides of the filter housing. As shown in FIG. 3, circuit board 10 has a serpentine conductor section 40 that provides electrical communication between the first 12 and second filter 13 sections. The upper shield members 27, as shown in FIG. 3, are configured the same as upper shield members 27 in FIG. 1. When the upper 20 and lower 1 filter housing members are assembled together (in the manner explained above), FIG. 4 shows that the lower 7 and upper 27 shield members abut to form mated disc shields (other abutting surfaces, as shown in FIG. 2, could also be used). As the recesses 8 in the shields are offset, the disc shields prevent any "line of sight" communication between the components of the first 12 and second filter 13 sections. This configuration provides sufficient magnetic isolation between the two filter sections in a four-pole notch filter type application.

In accordance with the present invention, when circuit board 10 is positioned in lower filter housing member 1, it is relatively easy to solder the ground termination between lower shield members 7 and the ground conductors on the circuit board. There is a possibility, however, that a space may exist between slots 11 in circuit board 10 and lower shield members 7. Solder may flow through this space below circuit board 10 in an uncontrolled manner. In an attempt to alleviate this potential problem, FIG. 5 shows an alternative embodiment of the filter device shown in FIG. 4, wherein ground posts 50 extend outwardly and upwardly from lower shield member 7 through a corresponding hole 51 in each filter section of circuit board 10. The ground posts could be soldered to the shields or formed integrally therewith when forming the shields. In the latter case, the ground posts should extend along the same axis as that of the casting operation used to form the shields (e.g., along the Z-axis direction).

When the ground posts extend upward through the circuit board, the upper portions thereof can be solder-terminated to the circuit board. Alternatively, the ground posts can be formed with a pedestal portion arranged below the circuit board and the upper portions thereof can be peened over to form a gas-free compression joint between a ground termination formed on the lower surface of the circuit board and an upper surface of the pedestal-shaped portion of the ground posts. Another option would be to terminate each ground post at the level of the pedestal portion and then insert a fastener (e.g., a screw) through the circuit board to form a gas-free compression joint between the ground termination formed on the lower surface of the circuit board and the pedestal portion of the ground post.

All of the above-described options are effective to prevent the problem of uncontrolled solder flow below the circuit board. That is, even if the ground posts are soldered to the circuit board, the soldering operation is performed at a position on circuit board 10 away from any space that might exist between slots 11 and lower shield members 7.

Figure 6:
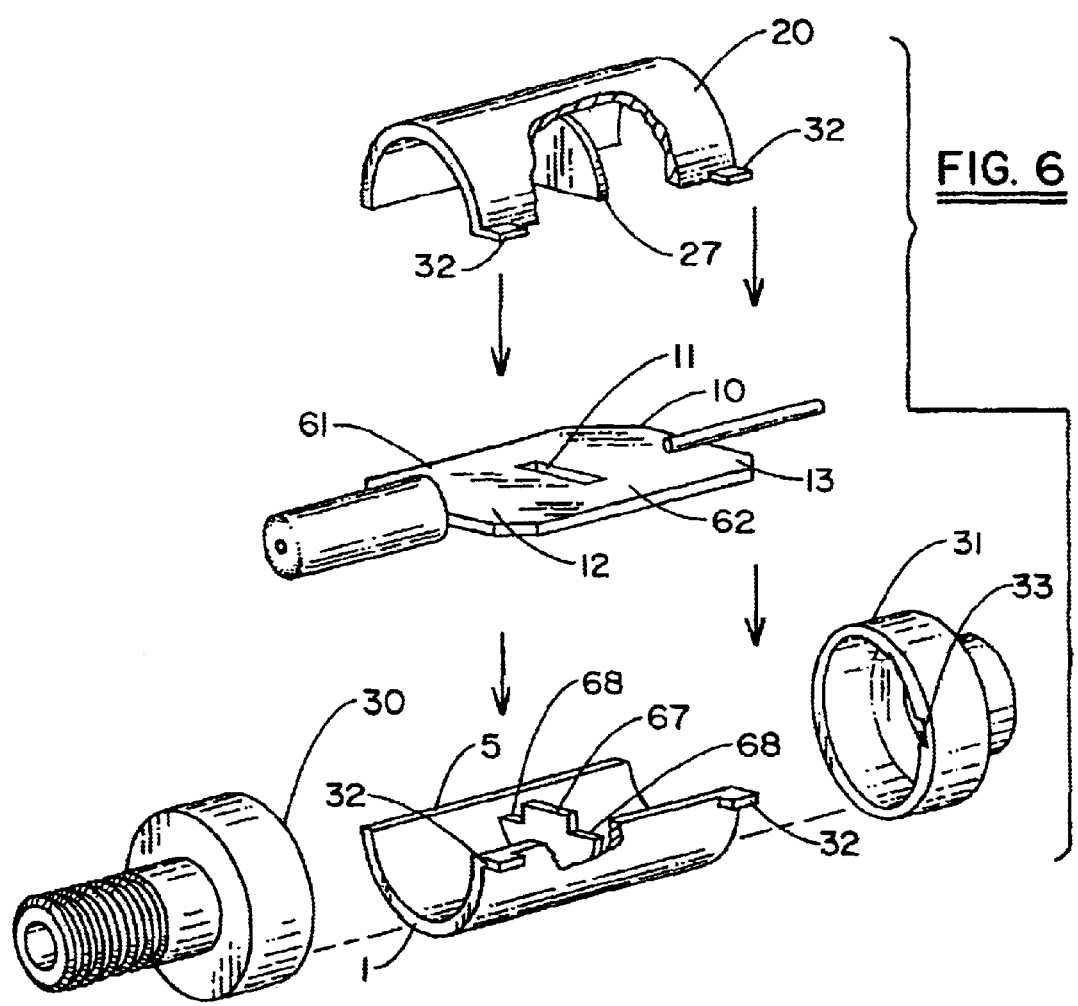
FIG. 6 is an exploded perspective view showing a filter in accordance with yet another embodiment of the present invention.
Figure 7:
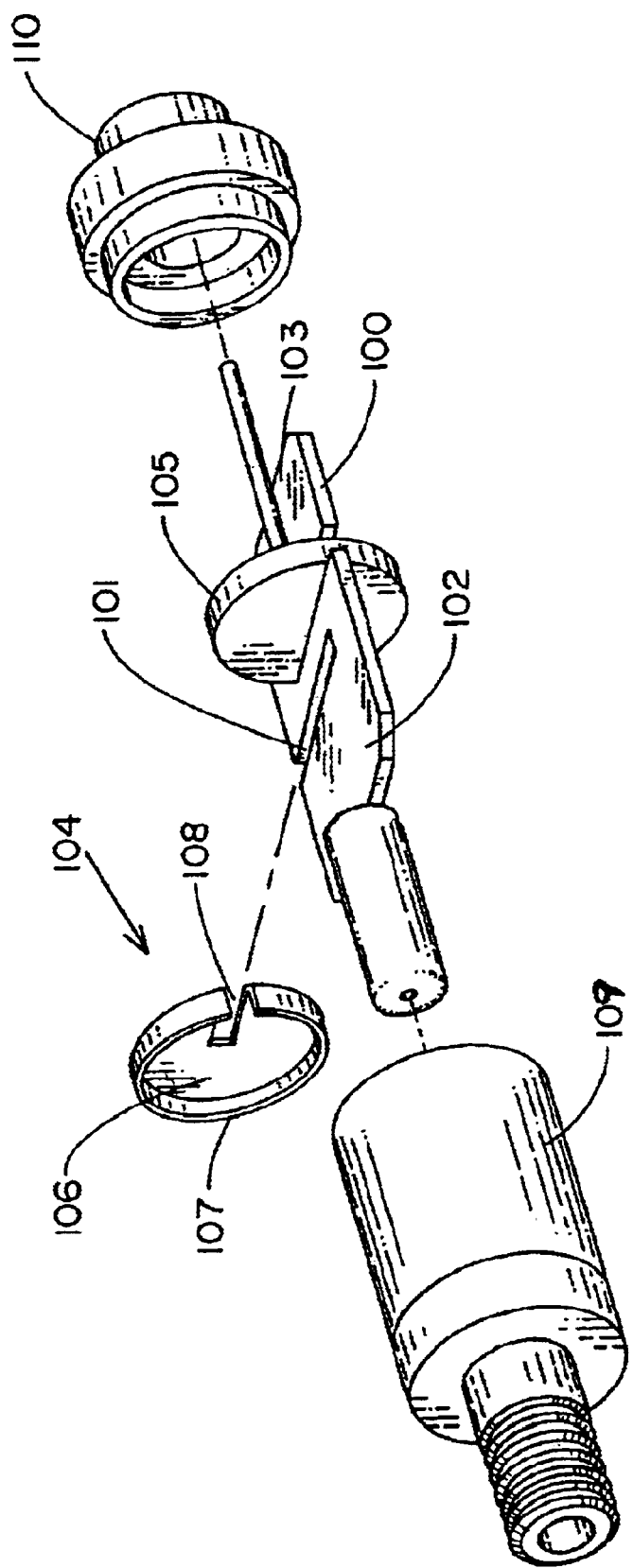
FIG. 7 is an exploded perspective view showing a filter in accordance with the prior art.

FIG. 6 shows yet another embodiment of a filter in accordance with the present invention. The filter includes the same components as in FIG. 3, except the two, recess-opposed lower shield members 7 are replaced with a single lower shield member 67 having recesses 68 on opposite sides thereof adjacent each longitudinal side surface 5, 6. The recesses 68 can be made sufficiently small to minimize any "line of sight" between components on the first 12 and second 13 filter sections.

FIG. 6 shows that slot 11 is formed in the interior of circuit board 10, thus leaving contiguous side portions 61, 62 on circuit board 10. A circuit board of this construction is more mechanically sound compared to the circuit board shown in FIG. 3. The conductor line connecting first 12 and second 13 filter sections can be formed on either side portion 61, 62.

Although not shown in the drawings, the slot 11 in circuit board 10 shown in FIG. 6 could be replaced with two slots on opposite sides of the circuit board, and a single recess 68 could be formed in a central region of lower shield member 67.

Figure 8A:
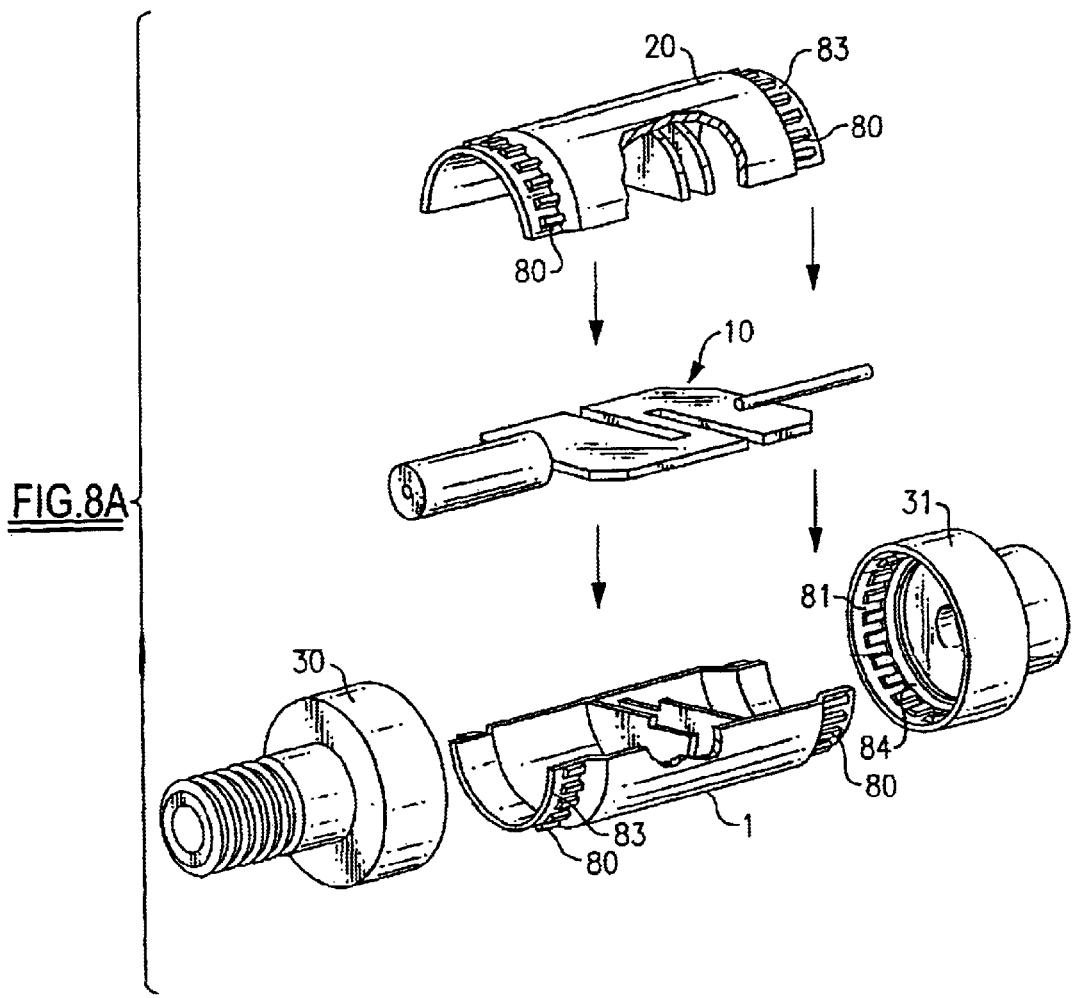
FIG. 8A is an exploded perspective view showing a filter in accordance with yet another embodiment of the present invention.
Figure 9A:
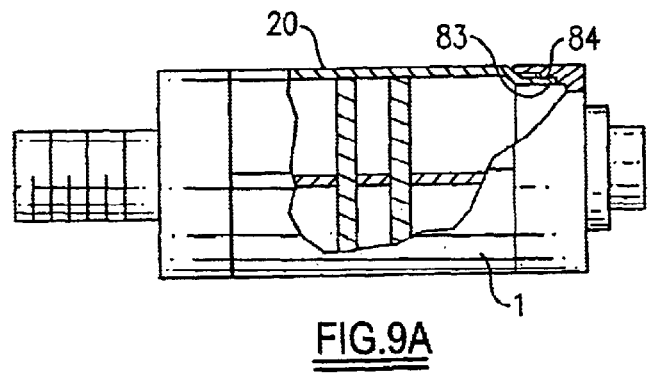
FIG. 9A is a partial sectional view of the filter of FIG. 8A.

FIGS. 8A and 9A show a filter in accordance with another embodiment of the present invention. Like reference numerals from the earlier drawings have been used herein to designate like structure.

In the embodiment shown in FIG. 8A, the boss members 32 and complementary grooves 33 have been removed from the lower 1 and upper 20 filter housing members, and from the end caps 30 and 31. A first mechanical engagement member, such as ribs 80, is formed on the outer surface of the lower 1 and upper 20 filter housing members, and mates with a complementary, second mechanical engagement member, such as grooves 81, formed on the inner surface of end caps 30 and 31 (not shown on end cap 30 in FIG. 8A).

Figure 11A:
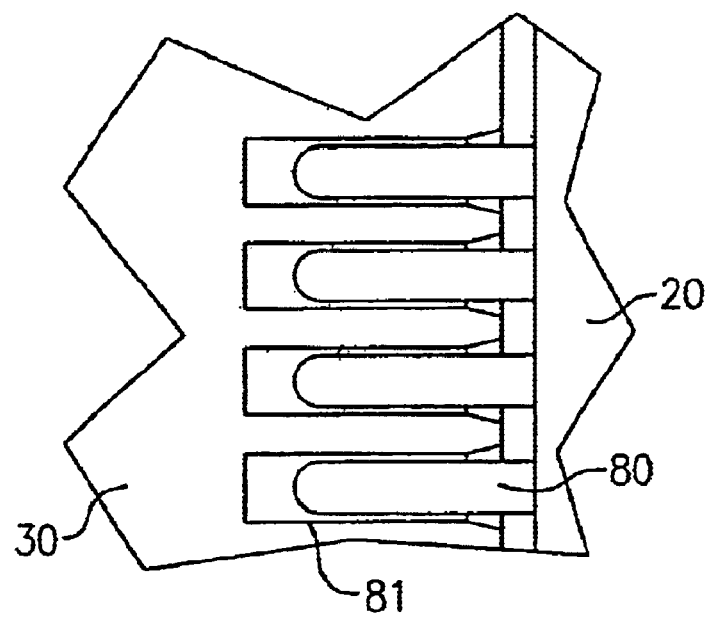
FIGS. 11A and 11B are partial plan and partial cross-sectional views showing the protruded ribs formed on the filter housing members and the grooves formed in the end caps.

As seen in FIG. 11A, the ribs 80 are spaced from the ends of the filter housing members such that a terminal portion 83 of the filter housing members can be press fit in a corresponding annular shoulder 84 formed in each end cap 30 and 31, as shown in FIG. 9A. The mechanical engagement members prevent rotation of the end caps 30 and 31 independent from the filter housing members 1 and 20. The press-fit between portion 83 and shoulder 84 maintains the component parts together until the parts can be sealed within an outer protective sleeve, as discussed below. If the housing members do not contain any access holes therein (to tune electronic components on the circuit board, for example), the press-fit between portion 83 and shoulder 84 can provide a gas-tight seal at this interface. If necessary, an additional sealant material, such as Loc-tite™ can be used at this interface, as well. Importantly, however, this design prevents the need for solder at this interface (to prevent rotation of the component parts), and thus eliminates an expensive step in the filter assembly process.

It is also preferred that each end cap 30, 31 includes a connection member having dual receiving sockets, such as the device disclosed in U.S. Pat. No. 6,273,766, assigned to Eagle Comtronics, Inc., the entirety of which is incorporated herein by reference. Providing a connection device having dual receiving sockets according to the 6,273,766 patent, with the exclusion of the seal-sealing features thereof, further enables a solderless connection between the lead wires extending from the circuit board 10 toward the respective end caps 30, 31.

Figure 8B:
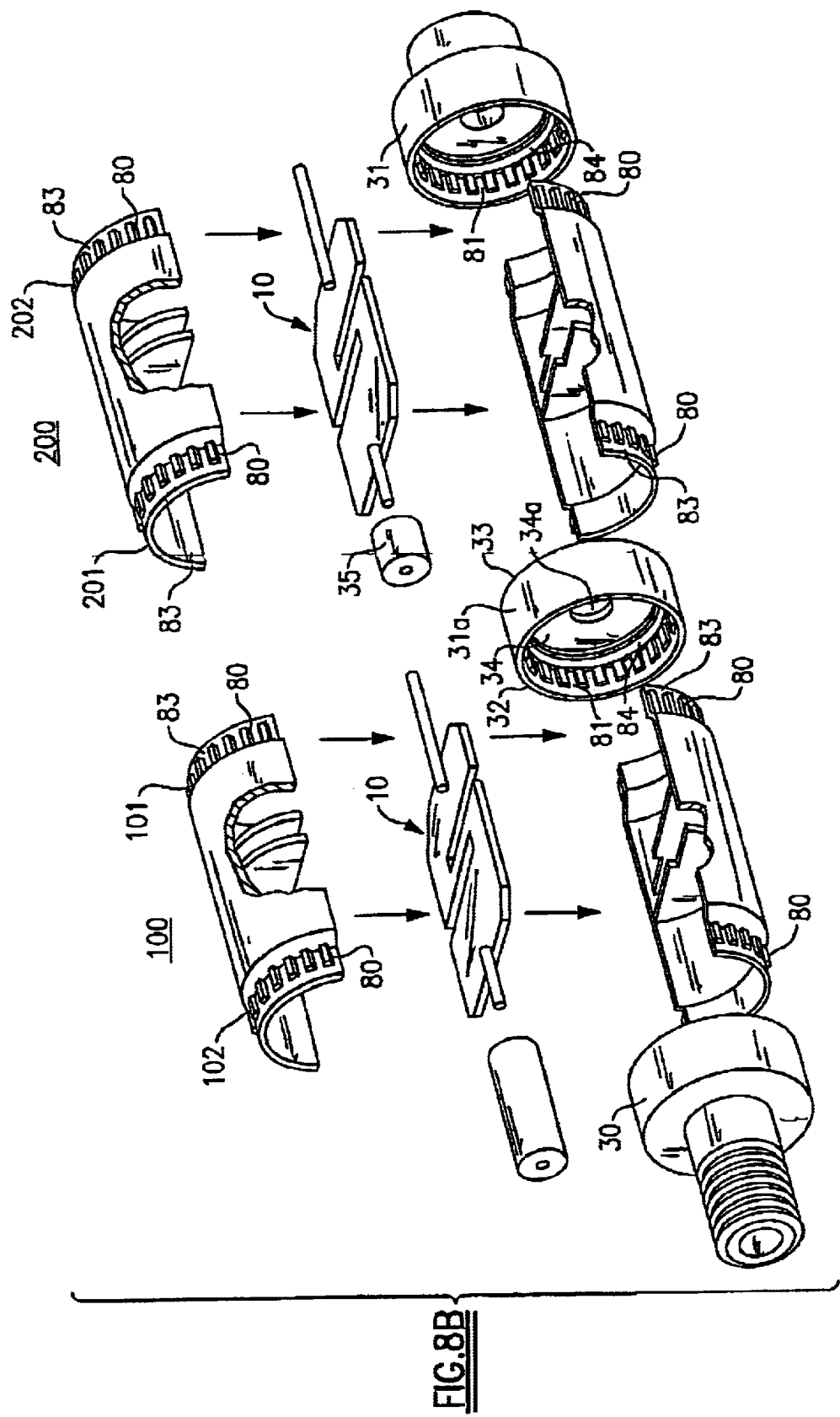
FIG. 8B is an exploded perspective view showing a modular filter assembly in accordance with yet another embodiment of the present invention.
Figure 9B:
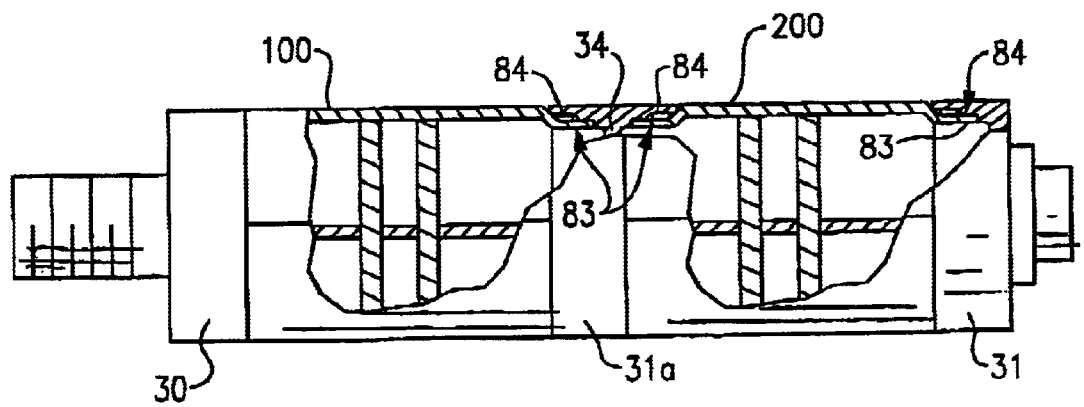
FIG. 9B is a partial sectional view of the modular filter assembly of FIG. 8B.
Figure 9C:
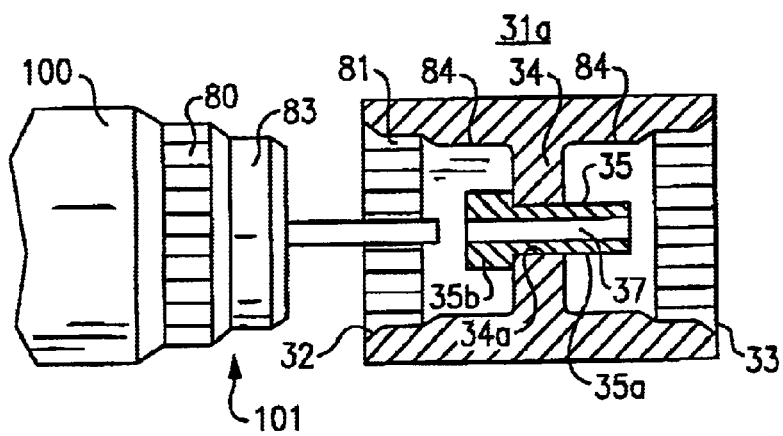
FIG. 9C is a cut-away side-view of the left hand filter housing member and coupling member of the modular filter assembly of FIGS. 8B and 9B.

FIG. 8B and FIGS. 9B and 9C show a filter assembly in accordance with another embodiment of the present invention. Again, like reference numerals from the earlier drawings have been used herein to designate like structure. FIG. 8B is an exploded perspective view showing a modular filter assembly and FIG. 9B is a partial sectional view of the modular filter assembly of FIG. 8B. FIG. 9C is a cut-away side-view of the left hand filter housing member and coupling member of the modular filter assembly of FIGS. 8B and 9B.

The assembly view of FIGS. 8B and 9B show a pair of vertically assembled split filter housing assemblies 100, 200 joined together in a horizontal direction via a coupling member 31a. The structure and components of the left-hand filter housing assembly 100 and the right-hand filter housing assembly 200 are described above with respect to the preceding figures. The coupling member 31a engages the terminal portions 83 of the first end 101 of the left hand filter housing assembly 100 and a terminal portion 83 of the first end 201 of the right hand filter assembly 200 to longitudinally connect the two filter assemblies.

As best seen in FIG. 8B, the first end 32 of the coupling member 31a includes a mechanical engagement member that essentially comprises a plurality of grooves 81, for example, formed on the inner peripheral surface thereof. Another mechanical engagement member is also provided, comprising another plurality of grooves 81 formed on the inner peripheral surface of the opposed second end 33 of the coupling member 31a. The mechanical engagement members on the first end 32 and the second end 33 of the coupling member 31a are separated from each other by an annular shoulder 84 on each side of a partition wall 34.

The partition wall 34 intersects the inner peripheral surface of the coupling member 31a in a direction substantially perpendicular to the axial direction of the coupling member 31a. As shown in FIG. 8B, the partition wall 34 includes a hole 34a through which an electrical connection member 35 is positioned during assembly. The electrical connection member 35 preferably includes a female-female type connector 37 (see FIG. 9C), such as the device with dual receiving sockets of the 6,273,766 patent, mentioned above in connection with the description of FIG. 8A. It should be noted, however, that the electrical connection member 35 does not necessarily include the seal-sealing features of the connector disclosed in the '766 patent.

Each end of the electrical connection member 35 receives a portion of a lead wire extending longitudinally from a respective circuit board beyond the terminal portions 83 of each of the filter housing assemblies 100, 200. In that manner, the lead wires are joined in electrical communication with one another via the electrical connection member 35. It should also be noted that the electrical connection member 35 can include an insulating portion substantially surrounding the conductive receiving sockets. One embodiment of a coupling member 31a having a pre-assembled electrical connection member 35 is described herein below with respect to FIG. 9C.

Since the inner diameter of the annular shoulders 84 on coupling member 31a is slightly smaller than the outer diameter of the terminal portions 83 of the left and right hand filter housing members 100, 200, the terminal portions 83 of the left and right hand filter housing members 100, 200, can be press fit within the coupling member 31a at the annular shoulders 84, on opposite sides of the partition wall 34. The mechanical engagement members, such as ribs 80, for example, provided on a respective outer peripheral surfaces of the first ends 101, 201 of the filter housing members 100, 200 engage the corresponding mechanical engagement members (i.e., grooves 81) provided on the inner peripheral surface of the coupling member 31a to prevent rotation of the coupling member 31a independent from the filter housing assemblies 100, 200. The press-fit between the terminal portions 83 of the filter housing members and the shoulders 84 of the coupling member 31a maintains the component parts together as an assembled unit, without the need to solder the assembly, at least until a time when the entire assembly can be sealed within an outer protective sleeve.

As seen more clearly in FIG. 9C, the ribs 80 are spaced a distance from the terminal ends 83 of the respective left and right hand filter housing assemblies 100, 200. The corresponding grooves 81 of the coupling member 31a are also spaced a distance from the partition wall 34 on either side thereof to define a peripheral press-fit between the terminal portions 83 and annular shoulders 84.

As shown in FIG. 9C, the coupling member 31a also includes a pre-assembled electrical connection member 35 including a female-female connector 37, such as a double receiving socket, which is substantially centrally disposed in a press-fit relationship within a hole 34a in the partition wall 34. The female-female connector 37 of the electrical connection member 35 provides a solderless electrical connection between the lead wires extending from the respective circuit boards and beyond the terminal portions 83 of the first and second filter housings. The insulating sheath surrounding the female-female connector 37, as shown, insulates the sockets and lead wires from the partition wall 34 of the coupling member 31a, and enables a stable electrical connection between the mechanically connected first and second filter housings.

It should also be noted that the receiving sockets can be substantially integrally formed as a portion of the partition wall, with or without additional insulating layers on either side thereof. Various embodiments of electrical connection members having female-female type electrical connection members that enable a solderless connection between the circuit boards of the filter housing members can be used without departing from the spirit or scope of the present invention.

The electrical connection member 35 shown in FIG. 9C extends from a first portion 35a having a first outer diameter to an integral second portion 35b having a second outer diameter of the first portion 35a that is larger than the first outer diameter of the first portion 35a. The female-female connector 37 disposed within a central bore formed within electrical connection member 35 also extends from the first portion 35a to the second portion 35b.

The first outer diameter of the first portion 35a is slightly larger than the diameter of the hole 34a in order to facilitate a secure press fit of the electrical connection member 35 within the hole 34a of the partition wall 34 of the coupling member 31a. The larger second outer diameter of the second portion 35b provides a shoulder portion which prevents over-insertion of the electrical connection member 35 within the hole 34a during assembly of the coupling member 31a.

The shoulder portion afforded by the larger second outer diameter of the second portion 35b also functions to maintain the proper spacial relationship between the electrical connection member 35 and the lead wires. That is, the lead wires are each longitudinally dimensioned to extend from a respective one of the first and second filter housing assemblies 100, 200 a predetermined distance within the coupling member 31a, such that the proper solderless electrical connection between the first and second filter assemblies 100, 200 is made without interfering in the operation of the mechanical engagement and anti-rotation members that effectively join the filter housing assemblies 100, 200 to one another via the coupling member 31a.

Figure 11B:
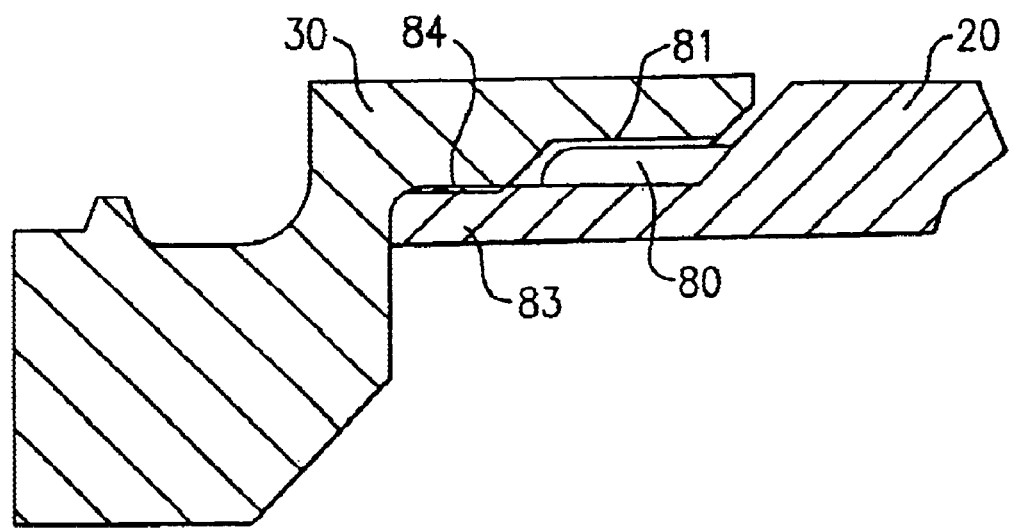

FIG. 11A shows that there is a clearance between the entirety of each rib 80 and its corresponding groove 81. This insures that the ribs and grooves will mate freely. FIG. 11B shows that the entry region 82 of each groove 81 is also outwardly chamfered. This insures that the ribs 80 will self-align with the grooves 81 when the end caps 30 and 31 are assembled on the ends of the abutted filter housing members 1 and 20. In addition to the above, since ribs 80, for example, extend around the entire periphery of an outer portion of the filter housing assemblies 100 and 200, and since grooves 81, for example, extend around the entire periphery of the inner surface of coupling member 31a, these parts assemble together without the need for any significant rotational alignment. This, in turn, facilitates automated machine assembly for these parts.

The second ends 102, 202 of the filter housing assemblies 100, 200 are also provided with a mechanical engagement member, such as ribs 90, for example, as shown in FIG. 8B. End caps 30, 31 are each provided with a corresponding mechanical engagement member, such as grooves 81, for example. End caps 30, 31 are joined to the second ends 102, 202 of the filter housing assemblies 100, 200 in essentially the same manner as described above with respect to FIG. 8A. Alternatively, end caps 30, 31 can be integrally formed at the second ends 102, 202 of the filter housings 100, 200, preferably in the case where these filter housings 100, 200 each comprise a single filter housing instead of the split housing assemblies comprising abutted upper a nd lower filter members as shown.

Figure 10:
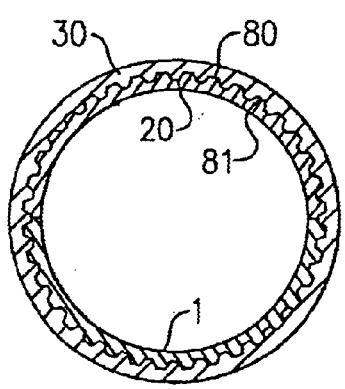
FIG. 10 is a radial cross-sectional view showing the interface between end caps 30 and 31 and the outer surface of upper 20 and lower 1 filter housing members.

FIG. 10 is a partial cross-sectional view showing the engagement between the ribs 80 formed on the outer surfaces of the lower 1 and upper 20 filter housing members, and the grooves formed on the inner surface of the end caps 30 and 31. Again, this engagement prevents rotation of the end caps independent of the filter housing members, which is important for the reasons explained earlier herein.

FIGS. 11A and 11B show that there is a clearance between the entirety of each rib 80 and its corresponding groove 81. As mentioned above, this insures that the ribs and grooves will mate freely.

FIG. 11A also shows that the entry region 82 of each groove 81 is outwardly chamfered. As mentioned above, this insures that the ribs 80 will self-align with the grooves 81 when the end caps 30 and 31 are assembled on the ends of the abutted filter housing members 1 and 20.

In addition to the above, since ribs 80 extend around the entire periphery of the filter housing members 1 and 20, and since grooves 81 extend around the entire inner surface of end caps 30 and 31, these parts assemble together without the need for any significant rotational alignment. Again, these features facilitate automated machine assembly for these parts.

Figure 13:
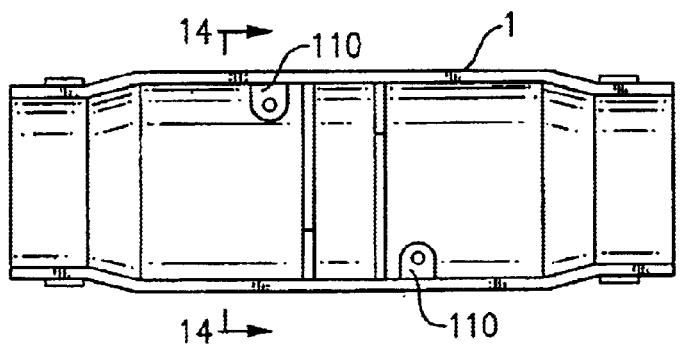
FIG. 13 is a top view of the lower filter housing member 1 shown in FIG. 12.
Figure 14:
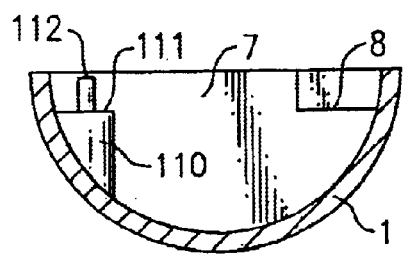
FIG. 14 is an end view of the lower filter housing member 1 shown in FIG. 12.

By using the structures shown in FIGS. 8–11, all of the soldering steps required to assemble the components of the final filter structure can be eliminated, except for the step of soldering the ground plane of the circuit board 10 to the filter housing and shields. This soldering step can also be eliminated, however, by adopting the embodiment shown in FIGS. 12–14. These drawings show that ground posts 110 can be integrally cast with the lower filter housing member 1. Each ground post 110 includes an upper shoulder 111 that is positioned at the same height as the recesses 8 in the lower shield members 7. Extending from the shoulder portion 111 is a ground pin 112. The entirety of the ground post, including the ground pin 112, is arranged along the Z-axis of the lower filter housing member 1.

Figure 12:
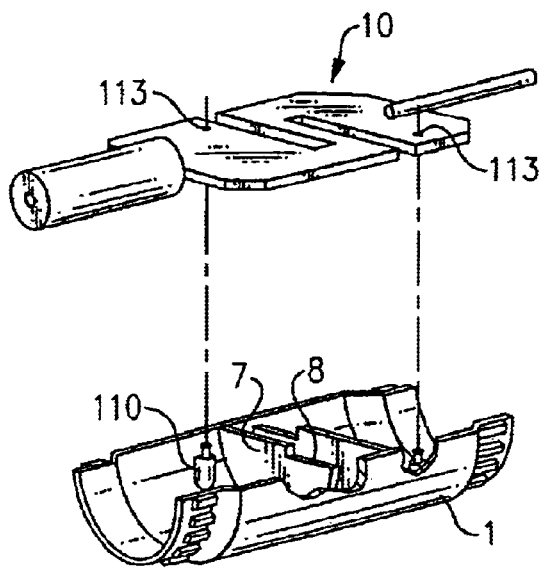
FIG. 12 is an exploded perspective view showing a filter in accordance with yet another embodiment of the present invention.

FIG. 12 shows that the circuit board is placed within the lower filter housing member 1 in the Z-axis manufacturing direction such that the ground pins 112 pass through corresponding ground holes 113 formed through circuit board 10. The height of the ground pin 112 is such that it will extend above the upper surface of the circuit board 10 when the circuit board is positioned within the lower filter housing member 1 and rests upon the bottom of the recesses 8 formed in each shield member 7.

Figure 15A:
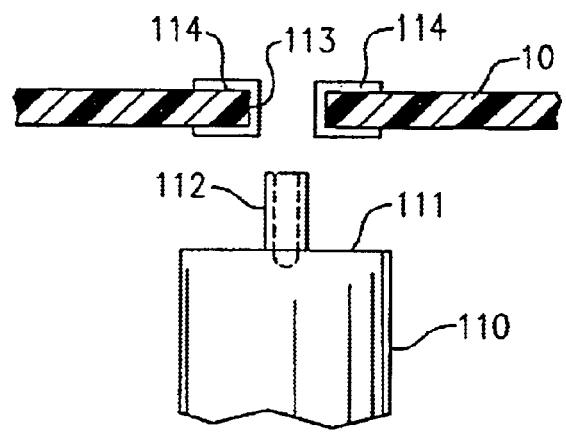
FIGS. 15A–15C show the progression of attaching the circuit board 10 to the ground post 110.
Figure 15B:
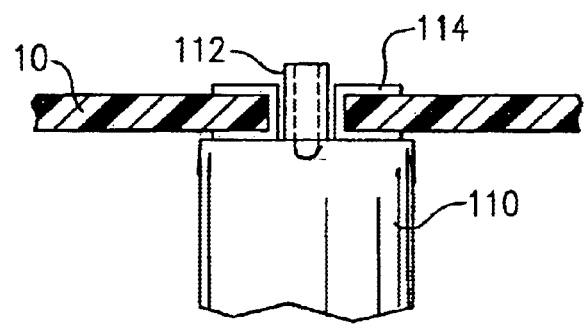
Figure 15C:
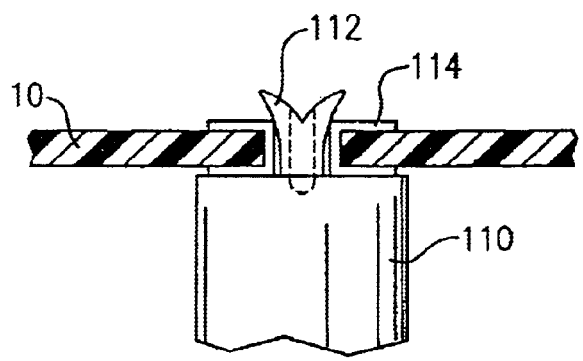

FIGS. 15A–15C show that the ground holes 113 formed through circuit board 10 preferably are plated with a metal such as copper, such that the plating 114 extends from the upper surface to the lower surface of circuit board 10 through the holes 113. FIGS. 15A–15C show that, once the circuit board is positioned on the ground post 110 in contact with the shoulder portion 111, the tip portion of ground pin 112 can be peened over to form mechanical and electrical contact (preferably a gas-free compression joint) between the ground post and the plated through-hole 113 in the circuit board 10. That is, the bottom of plating 114 is in intimate contact with shoulder portion 111 and the top of plating 114 is in intimate contact with portions of the peened ground pin 112.

Use of the filter shown in FIG. 12 eliminates all soldering steps necessary to assemble the component parts of the filter.

Again, while the circuit board will have been wave-soldered to secure the electronic components thereto, no soldering steps are necessary in the actual assembly of the filter components adopting the structure shown in FIG. 12.

Figure 16A:
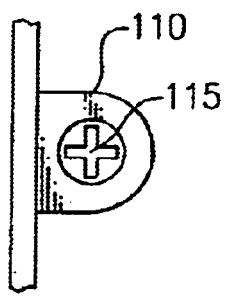
FIGS. 16A–16E are top views showing alternative forms for the pin of the ground post 10.

FIG. 16A is a top view of the ground post 110 showing a cross-shaped recess 115 extending into ground pin 112. This recess will assist in mechanical deformation of the tip portion of the ground pin 112 by allowing the ground pin to break at the cross tip portions, so that roughly quarter segments of the ground pin will be pressed outwardly and downwardly against the top of plating 114 during the peening operation.

Figure 16B:
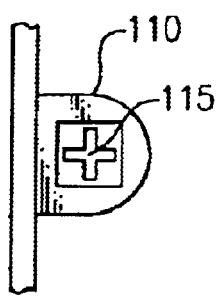

FIG. 16B shows another shape for the ground pin 112, which has a square cross-sectional shape and includes a cross-shaped hole therein. In this case, the tips of the cross are positioned adjacent the sides of the square so that the four corners of the ground pin 112 will separate and spread radially during the peening operation.

Figure 16C:
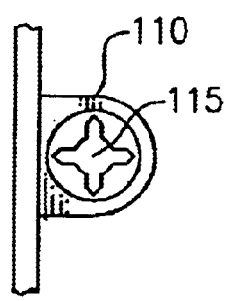
Figure 16D:
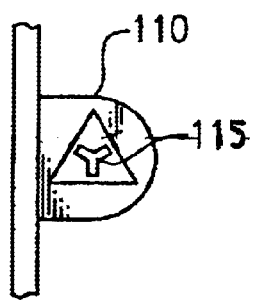
Figure 16E:
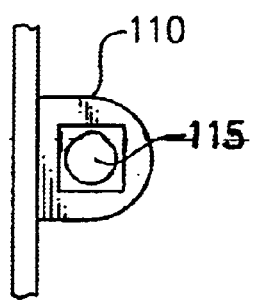

FIGS. 16C–16E show other configurations for the ground pin 112 and the recess 115 formed therein Any shaped recess 115 can be used so long as it assists in mechanical deformation of ground pin 112, or the hole could be eliminated altogether if the ground pin 112 is malleable enough to form a good mechanical and electrical contact with plating 114 after peening. While the depth of recess 115 is not necessarily critical, the recess should extend at least below the upper surface of circuit board 10 to insure that the peened tip portion of ground pin 112 makes good mechanical and electrical contact with the top of plating 114.

Figure 17:
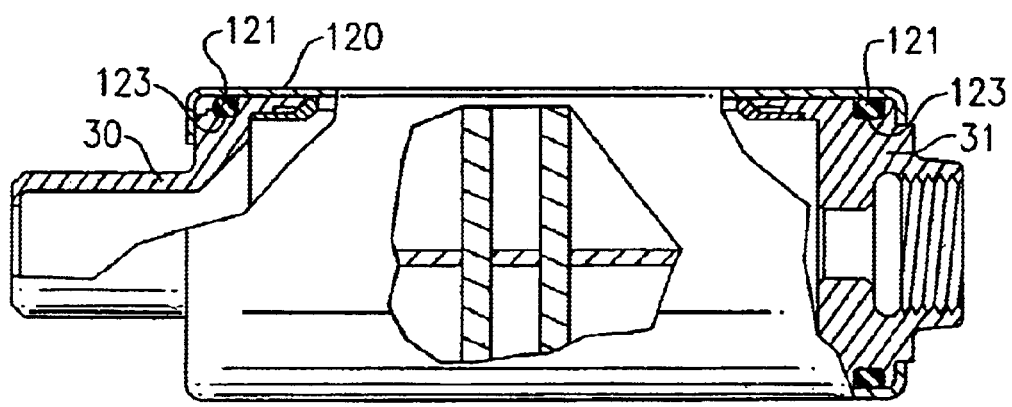
FIG. 17 shows an alternative embodiment of the filter shown in FIG. 9A, including a protective outer tube and O-rings to provide a water-tight filter housing.

FIG. 17 shows that it is also possible to provide an outer protective tube 120 that is rolled over the assembled filter housing members and end caps, and compresses O-rings 121 positioned in grooves 123 formed on the outer peripheries of end caps 30 and 31. Use of this outer protective tube in combination with the sealing techniques described in Zennamo et al. U.S. Pat. No. 5,662,494 (the entirety of which is incorporated herein by reference) provide a filter that is completely sealed from the environment without the need for soldering during assembly of the filter components.

While the present invention has been particularly shown and described with reference to the preferred mode as illustrated in the drawings, it will be understood by one skilled in the art that various changes in detail may be effected therein without departing from the spirit and scope of the invention as defined by the claims.

We claim:

1. A modular filter housing assembly:
  a plurality of elongate filter housings, including a first filter housing extending in a longitudinal direction from a first end thereof to an opposed second end thereof and having a mechanical engagement member provided on at least one of said first and second ends thereof, and a second filter housing extending in said longitudinal direction from a first end thereof to an opposed second end thereof and having a mechanical engagement member provided on at least one of said first and second ends thereof; and
  a coupling member having a first end provided with a corresponding mechanical engagement member to engage said mechanical engagement member provided on said one of said first and second ends of one of said first and second filter housings and an opposed second end provided with a corresponding mechanical engagement member to engage said mechanical engagement member provided on said one of said first and second ends of the other one of said first and second filter housings to join said first filter housing and said second filter housing to one another in a solderless connection via said coupling member.

2. The modular filter assembly of claim 1, wherein said mechanical engagement member of said first filter housing comprises an outer surface portion of said first end of said first filter housing having an outer diameter $d_1$, and said mechanical engagement member of said second filter housing comprises an outer surface portion of said first end of said second filter housing having an outer diameter $d_2$.

3. The modular filter assembly of claim 2, wherein said first end of said coupling member comprises an inner surface having an inner diameter $d_3$ and said second end of said coupling member comprises an inner surface having an inner diameter $d_4$, wherein $d_3$ is sufficiently less than $d_1$ to provide a secure mechanical press-fit between said first end of said first filter housing and said first end of said coupling member, and wherein $d_4$ is sufficiently less than $d_2$ to provide a secure mechanical press-fit between said first end of said second filter housing and said second end of said coupling member.

4. The modular filter assembly of claim 1, wherein said coupling member further comprises an electrical connection member for providing an electrical connection in a solderless manner between said first and said second filter housings.

5. The modular filter assembly of claim 1, wherein said mechanical engagement member of said first filter housing extends circumferentially around at least a portion of an outer surface thereof proximate said first end thereof, and said mechanical engagement member of said second filter housing extends circumferentially around at least a portion of an outer surface thereof proximate said first end thereof.

6. The modular filter assembly of claim 5, wherein each said mechanical engagement member of said first and said second filter housings further comprise an anti-rotational mechanism and said coupling member further comprises corresponding anti-rotational mechanisms.

7. The modular filter assembly of claim 6, wherein said anti-rotational mechanism of said first filter housing comprises one of a series of projected ribs and a series of grooves, and wherein said corresponding anti-rotational mechanism of said first end of said coupling member comprises the other one of a series of projected ribs and a series of grooves.

8. The modular filter assembly of claim 6, wherein said anti-rotational mechanism of said second filter housing comprises one of a series of projected ribs and a series of grooves, and wherein said corresponding anti-rotational mechanism of said second end of said coupling member comprises the other one of a series of projected ribs and a series of grooves.

9. The modular filter assembly of claim 2, wherein said first filter housing further comprises a mechanical engagement member formed on said second end thereof, and said second filter housing further comprises a mechanical engagement member formed on said second end thereof.

10. The modular filter assembly of claim 9, further comprising a first end cap positioned on said second end of said first filter housing and a second end cap positioned on said second end of said second filter housing.

11. The modular filter assembly of claim 10, wherein each said end cap comprises a mechanical engagement member provided on an inner surface thereof to engage a respective one of said mechanical engagement members provided on said second end of said first filter housing and said second end of said second filter housing.

12. The modular filter assembly of claim 11, wherein each mechanical engagement member of each said end cap further comprises an anti-rotational mechanism comprising one of a series of projected ribs and a series of grooves, and wherein each said mechanical engagement member of said second ends of said first and second filter housings further comprises an anti-rotational mechanism comprising the other one of a series of projected ribs and a series of grooves.

13. The modular filter assembly of claim 10, wherein said first and second end caps are integrally formed with said first and second filter housings, respectively.

14. The modular filter assembly of claim 10, wherein each said end cap further comprises an electrical connection member having dual receiving sockets for providing an electrical connection between each said end cap and said second end of a respective one of said first and second filter housings in a solderless manner.

15. The modular filter assembly of claim 10, further comprising an outer protective tube secured over said end caps, said first and second filter housings and said coupling member through interposed sealing members.

16. A modular electrical signal filter assembly, comprising:
   a plurality of elongate filter housings extending along a longitudinal direction from a first end thereof to an opposed second end thereof, each said filter housing comprising
      a lower filter housing member having an inner surface terminating at first and second upper side surfaces that extend from said first end thereof to said second end thereof, and
      an upper filter housing member having an inner surface terminating at first and second lower side surfaces that extend from said first end thereof to said second end thereof, each said upper filter housing member abutting one of said lower filter housing members at a junction between said first and second lower side surfaces and said first and second upper side surfaces, respectively, to thereby define one of said filter housings having a substantially continuous outer surface and an internal filter cavity;
   a first mechanical engagement member extending circumferentially around portions of said outer surface of each said filter housing proximate at least one of said first and second ends thereof; and
   a plurality of coupling members each extending from a first end thereof to an opposed second end thereof along said longitudinal direction, each said coupling member having a second mechanical engagement member formed on an inner peripheral surface thereof that is complementary to and mates with each said first mechanical engagement member of said filter housings;
   wherein at least one of said first and said second ends of each of said filter housings is secured to one of said first and said second ends of coupling member without solder, such that each of said filter housing is secured to another of said filter housings along said longitudinal direction in a solderless connection via said coupling members.

17. The modular filter assembly of claim 16, wherein said first mechanical engagement member comprises an outer surface portion of said first end of said filter housings having an outer diameter $d_1$.

18. The modular filter assembly of claim 17 wherein said first end of said coupling member comprises an inner surface having an inner diameter $d_2$ and said second end of said coupling member comprises an inner surface having an inner diameter $d_3$, wherein $d_2$ is sufficiently less than $d_1$ to provide a secure mechanical press-fit between said first end of one of said filter housings and said first end of said coupling member, and wherein $d_3$ is sufficiently less than $d_1$ to provide a secure mechanical press-fit between said first end of another one of said filter housings and said second end of said coupling member.

19. The modular filter assembly of claim 16, wherein said first mechanical engagement member extends circumferentially around at least a portion of an outer surface of each said filter housing proximate said first end thereof.

20. The modular filter assembly of claim 16, wherein each said coupling member further comprises an electrical connection member for providing an electrical connection in a solderless manner.

21. The modular filter assembly of claim 19, wherein each said first mechanical engagement members of said filter housings farther comprises an anti-rotational mechanism and said coupling member further comprises corresponding anti-rotational mechanisms.

22. The modular filter assembly of claim 21, wherein said anti-rotational mechanisms of said filter housings comprise one of a series of projected ribs and a series of grooves, and wherein said corresponding anti-rotational mechanisms of said first and second ends of said coupling member comprise the other one of a series of projected ribs and a series of grooves.

23. The modular filter assembly of claim 17, wherein said filter housings each further comprise mechanical engagement members formed on said second ends thereof.

24. The modular filter assembly of claim 23, further comprising a first end cap positioned on said second end of a first one of a series of said filter housings and a second end cap positioned said second end of a last one of said series of filter housings.

25. The modular filter assembly of claim 24, wherein each said end cap comprises a third mechanical engagement member provided on an inner surface thereof to engage a respective one of said first mechanical engagement members provided on said second ends of said first one of said filter housing a and said last one of said filter housings.

26. The modular filter assembly of claim 25, wherein each said third mechanical engagement member further comprises an anti-rotational mechanism comprising one of a series of projected ribs and a series of grooves, and wherein each said first mechanical engagement member of said second ends of said one first and said last one of said filter housings further comprises an anti-rotational mechanism comprising the other one of a series of projected ribs and a series of grooves.

27. The modular filter assembly of claim 24, wherein said first and second end caps are integrally formed with said first one and last one of said filter housings, respectively.

28. The modular filter assembly of claim 24, wherein each said end cap further comprises an electrical connection member having dual receiving sockets for providing an electrical connection between each said end cap and said second end of a respective one of said first one and said last one of said series of said filter housings in a solderless manner.

29. The modular filter assembly of claim 24, further comprising an outer protective tube secured over said end caps, said first and second filter housings and said coupling member through interposed sealing members.

* * * * *

UNITED STATES PATENT AND TRADEMARK OFFICE
CERTIFICATE OF CORRECTION

PATENT NO.     : 6,791,436 B2
DATED          : September 14, 2004
INVENTOR(S)    : Joseph A. Zennamo, Jr. and Joseph N. Maguire It is certified that error appears in the above-identified patent and that said Letters Patent is hereby corrected as shown below:

Column 15,
Line 48, change "elongate" to -- elongated --

Column 17,
Line 24, change "elongate" to -- elongated --

Signed and Sealed this

Seventh Day of December, 2004

JON W. DUDAS
*Director of the United States Patent and Trademark Office*